United States Patent
Kim

(10) Patent No.: US 7,332,949 B2
(45) Date of Patent: Feb. 19, 2008

(54) HIGH SPEED PULSE BASED FLIP-FLOP WITH A SCAN FUNCTION AND A DATA RETENTION FUNCTION

(75) Inventor: Min-Su Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 146 days.

(21) Appl. No.: 11/367,535

(22) Filed: Mar. 3, 2006

(65) Prior Publication Data

US 2006/0197571 A1 Sep. 7, 2006

(30) Foreign Application Priority Data

Mar. 3, 2005 (KR) ............... 10-2005-0017575

(51) Int. Cl.
*H03K 3/289* (2006.01)
(52) U.S. Cl. ............... 327/202; 327/200; 327/203; 327/218; 326/93
(58) Field of Classification Search ............ 326/93, 326/95, 98; 327/200–218
See application file for complete search history.

(56) References Cited

U.S. PATENT DOCUMENTS

| | | | |
|---|---|---|---|
| 5,973,529 A * | 10/1999 | Chappell et al. ............ 327/200 |
| 6,237,122 B1 | 5/2001 | Maki | |
| 6,404,254 B2 | 6/2002 | Iwaki et al. | |
| 6,433,601 B1 | 8/2002 | Ganesan | |
| 6,437,623 B1 * | 8/2002 | Hsu et al. .................. 327/202 |
| 7,154,317 B2 * | 12/2006 | Flynn et al. ................ 327/202 |
| 7,221,205 B2 * | 5/2007 | Kinkade et al. ............ 327/203 |
| 2003/0188241 A1 * | 10/2003 | Zyuban et al. .............. 714/726 |
| 2006/0273837 A1 * | 12/2006 | Shimazaki et al. ......... 327/202 |

FOREIGN PATENT DOCUMENTS

| | | |
|---|---|---|
| JP | 2001-324544 | 11/2001 |
| KR | 1020040011992 A | 2/2004 |

* cited by examiner

*Primary Examiner*—Vibol Tan
(74) *Attorney, Agent, or Firm*—F. Chau & Associates, LLC

(57) ABSTRACT

Provided is a multi-threshold CMOS (MTCMOS) flip-flop for latching a data input signal in response to a clock signal and converting the latched signal to a data output signal. The flip-flop includes: a latch unit receiving the data input signal in a normal mode, latching the data input signal based on pulse signals and internal clock signals, transferring the latched data to an output terminal of the latch unit, outputting the transferred data as the data output signal, and performing a scan function by latching a scan signal; a pulse generator generating the pulse signals based on the clock signal and a scan enable signal, the pulse signals including a pulse signal and an inverted pulse signal; and a scan and retention latch unit generating the internal clock signals based on the clock signal and the scan enable signal, the internal clock signals including an internal clock signal and an inverted internal clock signal, storing data last input to the latch unit during the normal mode in a sleep mode in response to a control signal for controlling the sleep mode and the normal mode, performing a data retention function by transferring the stored data to the latch unit when the flip-flop returns to the normal mode from the sleep mode, performing the scan function by latching the scan signal, and transferring the scan signal to the latch unit, wherein the latch unit is connected to the scan and retention latch unit via a signal transfer line.

25 Claims, 12 Drawing Sheets

HIGH SPEED PULSE BASED FLIP-FLOP WITH A SCAN FUNCTION AND A DATA RETENTION FUNCTION

CROSS-REFERENCE TO RELATED APPLICATION

This application claims priority to Korean Patent Application No. 10-2005-0017575, filed on Mar. 3, 2005 in the Korean Intellectual Property Office, the disclosure of which is incorporated by reference herein in its entirety.

BACKGROUND OF THE INVENTION

1. Technical Field

The present invention relates to a Multi-Threshold CMOS (MTCMOS) circuit, and more particularly, to a high speed pulse based flip-flop that has a scan function and a data retention function for use in an MTCMOS circuit.

2. Discussion of the Related Art

Battery dependent mobile devices capable of high performance and low power consumption are becoming increasingly prevalent in the marketplace. To produce these devices, semiconductor circuits having sizes below 100 µm are used. However, when using such circuits, a leakage current may increase during a sleep mode of the mobile device, thus reducing the battery life of the device.

One technique for reducing leakage currents in such small-sized semiconductor circuits is to use a Multi-Threshold CMOS (MTCMOS) circuit. The MTCMOS circuit uses low threshold voltage (low-Vth) CMOS transistors to implement a desired function and high threshold voltage (high-Vth) CMOS transistors to reduce the leakage current during the sleep mode of a semiconductor chip.

For example, when the MTCMOS circuit is powered off, in the sleep mode, the contents stored in a flip-flop of the MTCMOS circuit are deleted. Thus, the previous state of the MTCMOS circuit cannot be restored upon returning to a normal mode. To restore data of a previous state of the MTCMOS circuit, a retention flip-flop has been used. However, here, a high threshold voltage transistor must be used to retain the data and reduce the leakage current, thereby reducing the performance of the retention flip-flop.

One technique for reducing a delay in data input to output time due to a scan function and a retention function is to use a pulse based flip-flop and a separate latch for performing a data retention function and a flip-flop for performing a scan function. In this configuration, the scan function and the retention function are selectively performed to prevent an operating speed of a semiconductor chip from decreasing.

FIG. 1 is a circuit diagram of a conventional master slave flip-flop 10 having a data retention function. Referring to FIG. 1, the conventional master slave flip-flop 10 includes a separate retention latch unit 11 for retaining data when the flip-flop 10 is powered off. Even when the flip-flop 10 is powered off, power is supplied to the retention latch unit 11.

The conventional master slave flip-flop 10 also includes master terminal 13 and a slave terminal 15. The flip-flop 10 stores a value of the slave terminal 15 in the retention latch unit 11 before the flip-flop 10 is powered off. Therefore, even though data stored in the master and slave latches 13 and 15 is deleted, data stored in the retention latch unit 11 can be retained since power continues to be supplied to the retention latch unit 11. When the flip-flop 10 is powered on, data stored in the retention latch unit 11 is transferred to the slave terminal 15 to restore the conventional master slave flip-flop 10 to an original state.

FIG. 2 is a circuit diagram of a conventional master slave flip-flop 20 having a scan function. Referring to FIG. 2, the conventional master slave flip-flop 20 determines whether to capture a data value D in a normal mode or a test value TI in a test mode according to a test enable signal TE. When the test enable signal TE is logic 1, the test mode is activated to perform a test operation. When the test enable signal TE is logic 0, the normal mode is entered and a normal function is performed.

Although the combination of the conventional master slave flip-flop 10 and the conventional master slave flip-flop 20 enables the scan function and the data retention function to be selectively performed; however, when the scan function is applied to the conventional master slave flip-flop 10, a data input to output time is delayed, thereby reducing the operating speed of the semiconductor chip. Accordingly, there exists a need for flip-flop that is capable of performing a scan function and a data retention function without increasing the data input to output time.

SUMMARY OF THE INVENTION

The present invention provides a flip-flop with a scan function and a data retention function in a multi-threshold CMOS (MTCMOS) circuit that does not delay data input to output time, thereby increasing the operating speed of a semiconductor chip on which it is embodied.

According to an aspect of the present invention, there is provided an MTCMOS flip-flop for latching a data input signal in response to a clock signal and converting the latched signal to a data output signal, the flip-flop comprising: a latch unit receiving the data input signal in a normal mode, latching the data input signal based on pulse signals and internal clock signals, transferring the latched data to an output terminal of the latch unit, outputting the transferred data as the data output signal, and performing a scan function by latching a scan signal; a pulse generator generating the pulse signals based on a clock signal and a scan enable signal, the pulse signals including a pulse signal and an inverted pulse signal; and a scan and retention latch unit generating the internal clock signals based on the clock signal and the scan enable signal, the internal clock signals including an internal clock signal and an inverted internal clock signal, storing data last input to the latch unit during the normal mode in a sleep mode in response to a control signal for controlling the sleep mode and the normal mode, performing a data retention function by transferring the stored data to the latch unit when the flip-flop returns to the normal mode from the sleep mode, performing the scan function by latching the scan signal, and transferring the scan signal to the latch unit, wherein the latch unit is connected to the scan and retention latch unit via a signal transfer line. The pulse signals and the internal clock signals are exclusively generated.

The flip-flop may have a master-slave flip-flop structure in which the scan and retention latch unit is a master and the latch unit is a slave when performing the scan function.

When the scan enable signal is in a first state, the latch unit may latch the data input signal in an input terminal of the latch unit based on a state of the pulse signals, and when the scan enable signal is in a second state, the latch unit latches the scan signal in the scan and retention latch unit based on the internal clock signals.

When the flip-flop performs the normal function, the latch unit may transfer data to the scan and retention latch unit via the signal transfer line, when the flip-flop performs the data retention function, the scan and retention latch unit stops receiving a signal output from the latch unit and retains data received from the latch unit during the normal mode, when the flip-flop returns to the normal mode, the latch unit may receive data stored in the scan and retention latch unit via the signal transfer line, when the flip-flop performs the scan function, the scan and retention latch unit may receive the scan signal, the latch unit outputs the scan signal output from the scan and retention latch unit, and the flip-flop has the master-slave flip-flop structure in which the scan and retention latch unit is the master and the latch unit is the slave.

The latch unit may comprise: a first tri-state buffer receiving the data input signal and transferring the data input signal in response to the pulse signals; a second tri-state buffer transferring a signal of the signal transfer line in response to the pulse signals; a third tri-state buffer transferring outputs of the first and second tri-state buffers to the signal transfer line in response to the internal clock signals; and an inverter inverting the outputs of the first and second tri-state buffers and outputting the inverted outputs, wherein an output of the inverter is the data output signal of the flip-flop.

The latch unit may comprise: a first tri-state buffer receiving the data input signal and transferring the data input signal in response to the pulse signals; a second tri-state buffer transferring a signal of the signal transfer line in response to the pulse signals; a PMOS transistor, a first NMOS transistor, and a second NMOS transistor connected in series between a voltage source and a virtual ground; and an inverter inverting the outputs of the first and second tri-state buffers and outputting the inverted outputs, wherein gates of the PMOS transistor and the first NMOS transistor are connected to output terminals of the first and second tri-state buffers, the inverted internal clock signal is applied to a gate of the second NMOS transistor, and a node between the PMOS transistor and the first NMOS transistor is applied to the signal transfer line.

The pulse generator may comprise: first and second PMOS transistors connected in parallel between a voltage source and a first node; first and second NMOS transistors connected in series between the first node and a virtual ground; third and fourth PMOS transistors connected in series between the voltage source and a second node; third and fourth NMOS transistors connected in series between the second node and the virtual ground; fifth and sixth NMOS transistors connected in parallel between the second node and the virtual ground; a first inverter inverting an output of the first node and outputting the inverted signal; and a second inverter inverting a signal of the second node and outputting the inverted signal, wherein the clock signal is applied to gates of the first PMOS transistor, the first NMOS transistor, the fourth PMOS transistor, and the third NMOS transistor, the scan enable signal is applied to gates of the third PMOS transistor and the sixth NMOS transistor, the signal of the second node is applied to gates of the second PMOS transistor and the second NMOS transistor, an output of the first inverter is applied to a gate of the fifth NMOS transistor, and an output of the second inverter is applied to a gate of the fourth NMOS transistor; and an output of the first node is the inverted pulse signal, and the output of the first inverter is the pulse signal.

The scan and retention latch unit may comprise: an internal clock generator receiving the clock signal, the scan enable signal, and the control signal, and generating the internal clock signals; a multiplexer selectively outputting the scan signal and a signal applied to the latch unit via the signal transfer line in response to the scan enable signal; a first transfer gate transferring an output of the multiplexer in response to the internal clock signals; first and second inverters inverting an output of the first transfer gate; a tri-state buffer transferring an output of the first inverter to inputs of the first and second inverters in response to the internal clock signals; and a second transfer gate transferring an output of the second inverter to the signal transfer line in response to the internal clock signals.

The internal clock generator may comprise: first and second PMOS transistors connected in parallel between a voltage source and a first node; a third PMOS transistor connected between the first node and a second node; a first NMOS transistor connected between the second node and a ground voltage; second and third NMOS transistors connected in series between the second node and the ground voltage; a first inverter inverting the scan enable signal; and a second inverter inverting an output of the second node, wherein the scan enable signal is applied to gates of the first PMOS transistor and the third NMOS transistor, the clock signal is applied to the second PMOS transistor and the second NMOS transistor, and the control signal is applied to gates of the third PMOS transistor and the first NMOS transistor, the second node is the inverted internal clock signal, an output of the first inverter is an inverted scan enable signal, and an output of the second inverter is the internal clock signal.

The multiplexer may comprise: sixth and seventh PMOS transistors connected in series between a voltage source and a third node; eighth and ninth PMOS transistors connected in series between the voltage source and the third node; sixth and seventh NMOS transistors connected in series between the third node and a virtual ground; eighth and ninth NMOS transistors connected in series between the third node and the virtual ground, wherein the signal transfer line is connected to gates of the sixth PMOS transistor and the seventh NMOS transistor, the scan enable signal is applied to gates of the seventh PMOS transistor and the eighth NMOS transistor, the scan signal is applied to the eighth PMOS transistor and the ninth NMOS transistor, and the inverted scan enable signal is applied to the ninth PMOS transistor and the sixth NMOS transistor.

The first transfer gate may comprise: a tenth PMOS transistor and a tenth NMOS transistor connected in parallel between the third node and input terminals of the first and second inverters, wherein the internal clock signal is applied to a gate of the tenth PMOS transistor and the inverted internal clock signal is applied to the tenth NMOS transistor, and the second transfer gate may comprise: an eleventh PMOS transistor and an eleventh NMOS transistor connected in parallel between an output terminal of the second inverter and the signal transfer line, wherein the inverted internal clock signal is applied to a gate of the eleventh PMOS transistor and the internal clock signal is applied to a gate of the eleventh NMOS transistor.

According to another aspect of the present invention, there is provided an MTCMOS flip-flop for latching a data input signal in response to a clock signal and converting the latched signal to a data output signal, the flip-flop comprising: a latch unit receiving the data input signal in a normal mode, latching the data input signal based on pulse signals and internal clock signals, transferring the latched data to an output terminal of the latch unit, and outputting the transferred data as the data output signal; a pulse generator generating the pulse signals based on a clock signal, the pulse signals including a pulse signal and an inverted pulse signal; and a scan and retention latch unit generating the internal clock signals based on the clock signal, the internal clock signals including an internal clock signal and an inverted internal clock signal, storing data last input to the latch unit during the normal mode in the sleep mode in response to a control signal for controlling the sleep mode and the normal mode, and performing a data retention function by transferring the stored data to the latch unit when the flip-flop returns to the normal mode from the sleep mode, wherein the latch unit is applied to the scan and retention latch unit via a signal transfer line. The pulse signals and the internal clock signals are exclusively generated.

BRIEF DESCRIPTION OF THE DRAWINGS

The above features of the present invention will become more apparent by describing in detail exemplary embodiments thereof with reference to the attached drawings in which.

DETAILED DESCRIPTION OF EXEMPLARY EMBODIMENTS

Figure 1:
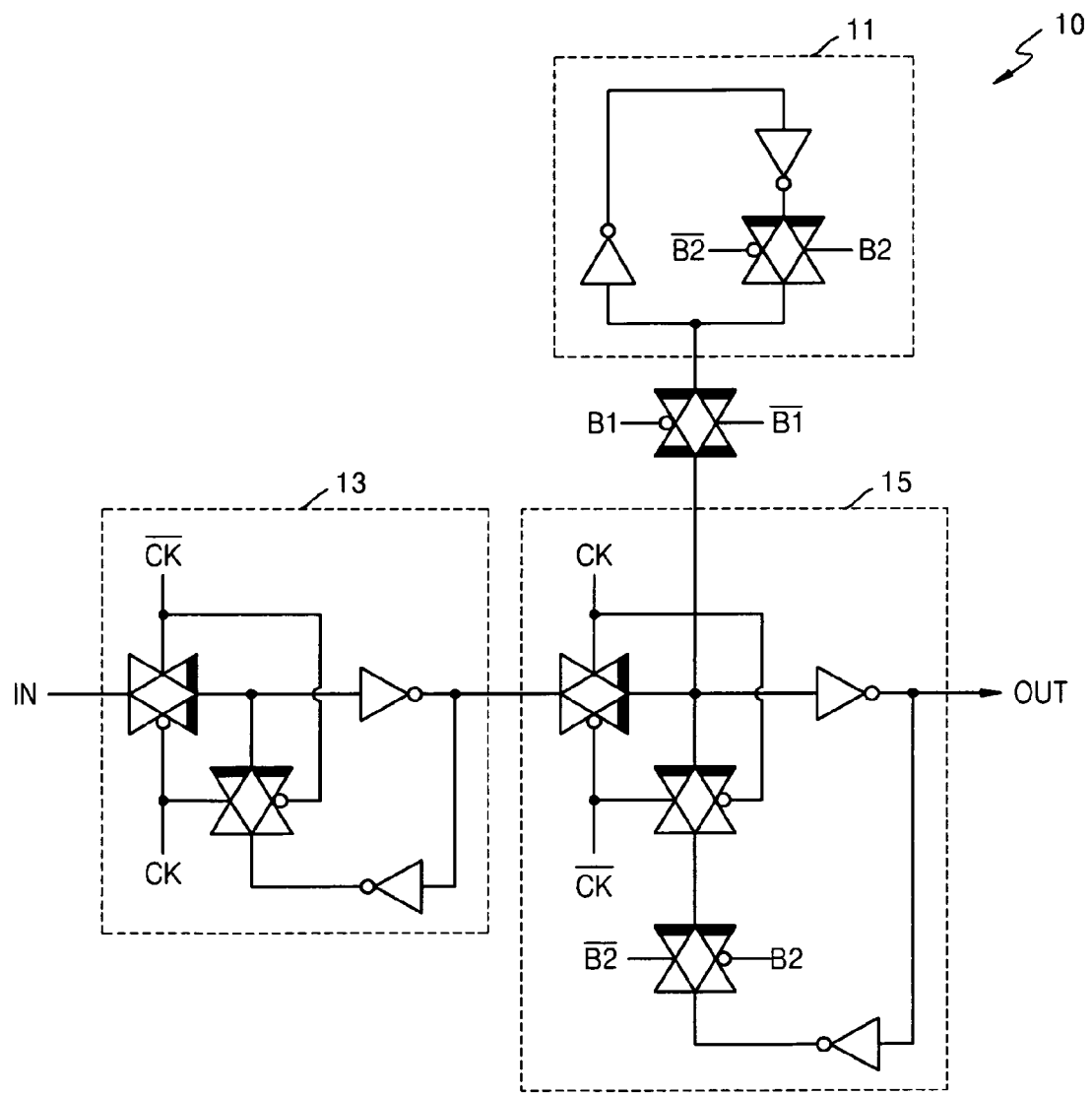
FIG. 1 is a circuit diagram of a conventional master slave flip-flop having a data retention function.
Figure 2:
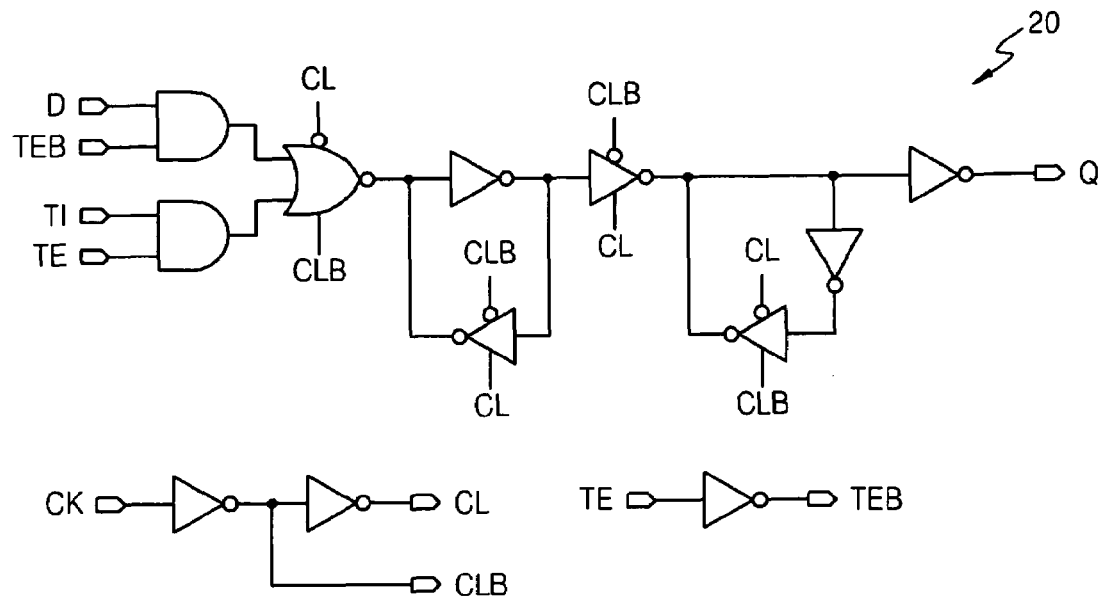
FIG. 2 is a circuit diagram of a conventional master slave flip-flop having a scan function.

Hereinafter, exemplary embodiments of the present invention will be described more fully with reference to the accompanying drawings. Like reference numerals in the drawings denote like elements.

Figure 3:
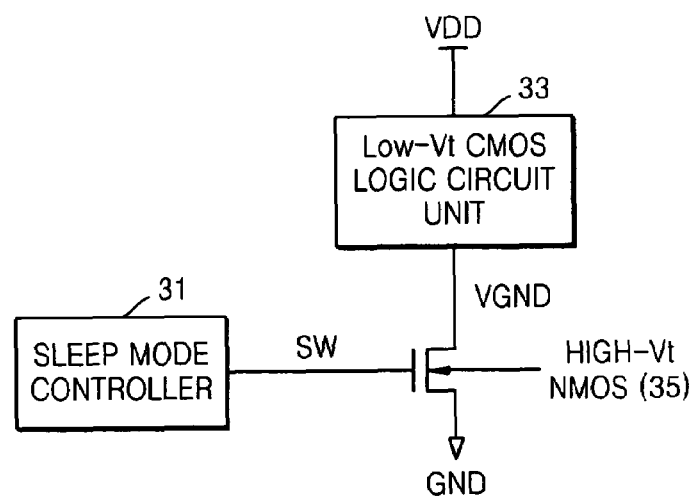
FIG. 3 is a schematic diagram of an MTCMOS circuit using a high threshold voltage NMOS switch.
Figure 4:
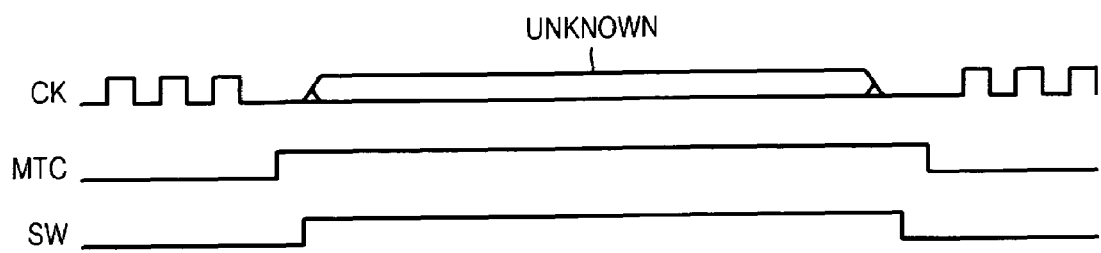
FIG. 4 is a waveform diagram of a signal applied to the MTCMOS circuit in FIG. 3.

FIG. 3 is a schematic diagram of a multi-threshold CMOS (MTCMOS) using a high threshold voltage NMOS switch. FIG. 4 is a waveform diagram of a signal applied in FIG. 3.

Referring to FIGS. 3 and 4, if a switching control signal SW of logic 0, which is output from a sleep mode controller 31, is applied to an NMOS switch 35 having a high threshold voltage, a logic circuit unit 33 including a low threshold voltage CMOS is powered off. As illustrated in FIG. 4, a clock CK is set to logic 0 before the switching control signal SW of logic 0 is applied, a retention control signal MTC is applied, and data of a retention flip-flop is protected. Thereafter, the switching control signal SW is applied and the logic circuit unit 33 is powered off.

When the MTCMOS is returned to a normal mode, a switching control signal SW of logic 1 is applied to the NMOS switch 35, power is supplied to the logic circuit unit 33, and data stored in the retention flip-flop is restored to the logic circuit unit 33. Meanwhile, signals other than retention-related signals such as the clock CK or a reset/set switch are unknown during a period in which the switching control signal SW of logic 1 is applied.

Figure 5:
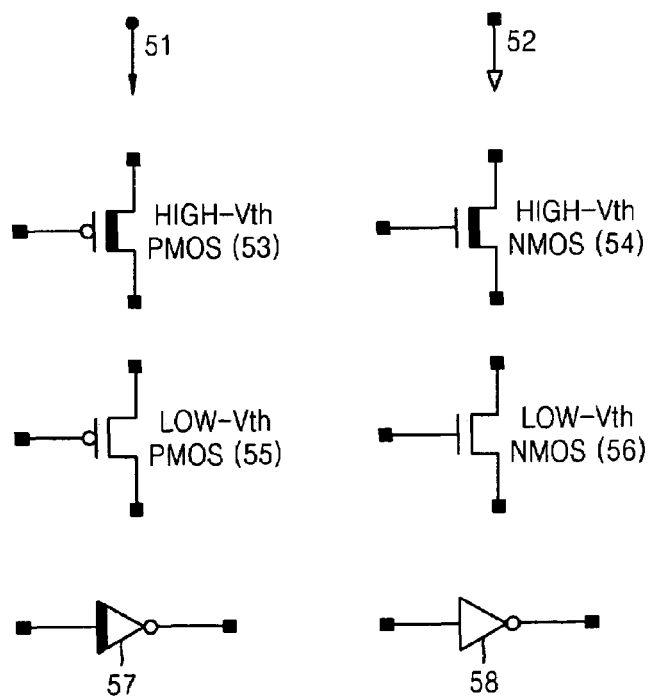
FIG. 5 illustrates circuit symbols used to describe an exemplary embodiment of the present invention.

FIG. 5 illustrates circuit symbols used to describe an exemplary embodiment of the present invention.

The circuit symbols illustrated in FIG. 5 include a virtual ground 51, a real ground 52, a PMOS transistor having a high threshold voltage 53, and an NMOS transistor having a high threshold voltage 54, both of which are differentiated by a bold line. Further included are a PMOS transistor 55 having a low threshold voltage and an NMOS transistor 56 having a low threshold voltage. A reference numeral 57 indicates an inverter having a high threshold voltage applied to the real ground 52, the inverter is differentiated by a bold line, and a reference numeral 58 indicates an inverter having a low threshold voltage applied to the virtual ground 51.

Figure 6:
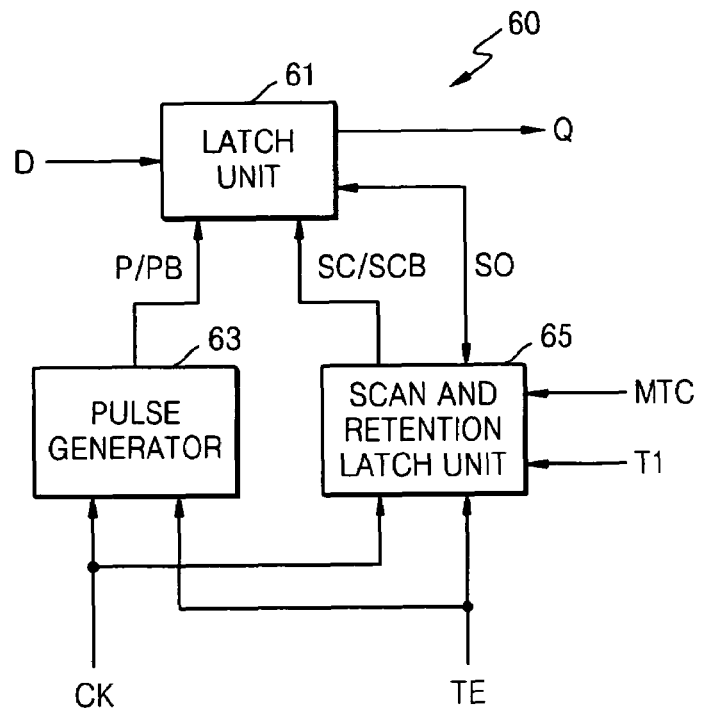
FIG. 6 is a schematic diagram of a flip-flop having a scan function and a data retention function according to an exemplary embodiment of the present invention.

FIG. 6 is a schematic diagram of a flip-flop 60 having a scan function and a data retention function according to an exemplary embodiment of the present invention. Referring to FIG. 6, the flip-flop 60 includes a latch unit 61, a pulse generator 63, and a scan and retention latch unit 65.

The flip-flop 60 performs a latch function or the scan function at a high speed using low power, and performs the data retention function when an MTCMOS is in a sleep mode.

The latch unit 61 receives input data D in the normal mode of the flip-flop 60, transfers the input data D to an output terminal based on pulses P and PB, and outputs output data Q.

The pulse generator 63 generates complementary pulses P and PB based on a clock signal CK and a scan enable signal TE. The scan and retention latch unit 65 generates complementary internal clock signals SC and SCB based on the clock signal CK and the scan enable signal TE.

The scan and retention latch unit 65 is controlled by the clock signal CK, the scan enable signal TE, and an MTCMOS control signal MTC and transfers data SO to/from the latch unit 61. When the flip-flop 60 performs the data retention function, the scan and retention latch unit 65 stores the data SO received from the latch unit 61. In this case, the data SO is included in the latch unit 61 during a normal mode. When the flip-flop 60 performs the scan function, the scan and retention latch unit 65 receives a scan input signal TI, and the latch unit 61 receives the data SO from the scan and retention latch unit 65 and performs the scan function. In this case, the data SO is the scan input signal TI.

For example, when the scan enable signal TE is in a first state, e.g., logic 0, the latch unit 61 latches the input data D to an input terminal based on the complementary pulses P and PB. The latch unit 61 then performs a normal latch function. However, when the scan enable signal TE is in a second state, e.g., logic 1, the latch unit 61 latches the scan input signal TI based on the complementary internal clock signals SC and SCB. The scan and retention latch unit 65 and the latch unit 61 then perform the scan function.

If the MTCMOS control signal MTC and the scan enable signal TE are in the first state, the flip-flop 60 performs a normal function and a value of the latch unit 61 is transferred to the scan and retention latch unit 65 via an SO line. If the MTCMOS control signal MTC is in the second state, the scan and retention latch unit 65 does not receive the value of the latch unit 61, retains a most recently received value, and thereby retains data when the flip-flop 60 is powered off. When the flip-flop 60 is powered on, the latch unit 61 receives data of the scan and retention latch unit 65.

To be more specific, data of the latch unit 61 is identical to data of the scan and retention latch unit 65 before the flip-flop 60 is powered off, an unknown value is stored in the latch unit 61 after the flip-flop 60 is powered off, and the value of the scan and retention latch unit 65 is transferred to the latch unit 61 via the SO line when the flip-flop 60 is powered on. When the MTCMOS control signal MTC transitions from the second state to the first state, the normal function is performed.

When the MTCMOS control signal MTC is in the first state and the scan enable signal TE is in the second state, the scan and retention latch unit 65 does not store data in the latch unit 61 via the SO line. Instead, the scan and retention latch unit 65 receives a scan input signal TI and operates in a master slave flip-flop structure where the scan and retention latch unit 65 is a master and the latch unit 61 is a slave. In this case, the pulse generator 63 is not operated and the flip-flop 60 performs the scan function in the master slave flip-flop. In other words, the output of the flip-flop 60 is Q, which is identical to that of the normal mode; however, the input of the flip-flop 60 is TI not D.

It is to be understood that the scan enable signal TE is transmitted when the clock signal CK is logic 0. Further, the scan enable signal TE may be designed to be an output of a latch.

Figure 7:
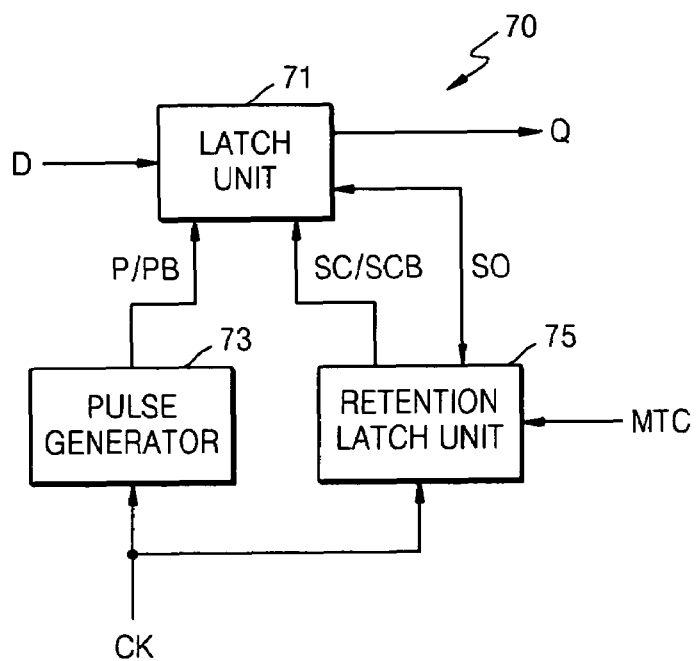
FIG. 7 is a schematic diagram of a flip-flop having a data retention function according to an exemplary embodiment of the present invention.

FIG. 7 is a schematic circuit diagram of a flip-flop 70 having a retention function according to an exemplary embodiment of the present invention. Referring to FIG. 7, the flip-flop 70 includes a latch unit 71, a pulse generator 73, and a retention latch unit 75.

Unlike the flip-flop 60 illustrated in FIG. 6, the flip-flop 70 does not have the scan function. In addition, unlike the flip-flop 10 illustrated in FIG. 1, the flip-flop 70 is pulse based in the latch unit 71, thereby reducing a data input to output delay of the flip flop 10 when the flip-flop 10 is in the normal mode by as much as 50 percent.

The operation of the flip-flop 70 will now be described. The latch unit 71 performs the same function as that of the latch unit 61. The retention latch unit 75 generates the complementary internal clock signals SC and SCB based on the clock signal CK. The complementary pulses P and PB and the complementary internal clock signals SC and SCB are exclusively generated with respect to each other. The retention latch unit 75 is controlled according to the clock signal CK and the MTCMOS control signal MTC, and transfers data SO to/from the latch unit 71. When the flip-flop 70 performs the data retention function, the retention latch unit 75 stores the data SO received from the latch unit 71. In this case, the data SO received during the normal mode is included in the latch unit 71.

When the MTCMOS control signal MTC is in the first state, the flip-flop 70 performs the normal function, and a value of the latch unit 71 is transferred to the retention latch unit 75 via the SO line. When the MTCMOS control signal MTC is in the second state, the retention latch unit 75 does not receive the value of the latch unit 71. Instead, the retention latch unit 75 retains a most recently received value, thereby retaining data when the flip-flop 70 is powered off. When the flip-flop 70 is powered on, the latch unit 71 receives the data of the retention latch unit 75.

To be more specific, data of the latch unit 71 is identical to data of the retention latch unit 75 before the flip-flop 70 is powered off, and an unknown value is stored in the latch unit 71 after the flip-flop 70 is powered off and the value of the retention latch unit 75 is transferred to the latch unit 71 via the SO line when the flip-flop 70 is powered on. When the MTCMOS control signal MTC transitions from the second state to the first state, the normal function is performed.

Figure 8A:
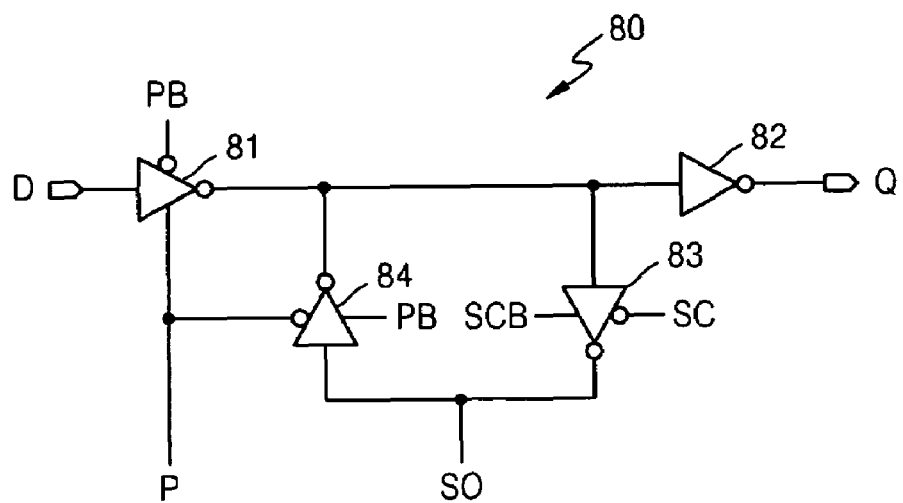
FIGS. 8A and 8B are circuit diagrams of latch units illustrated in FIGS. 6 and 7.
Figure 8B:
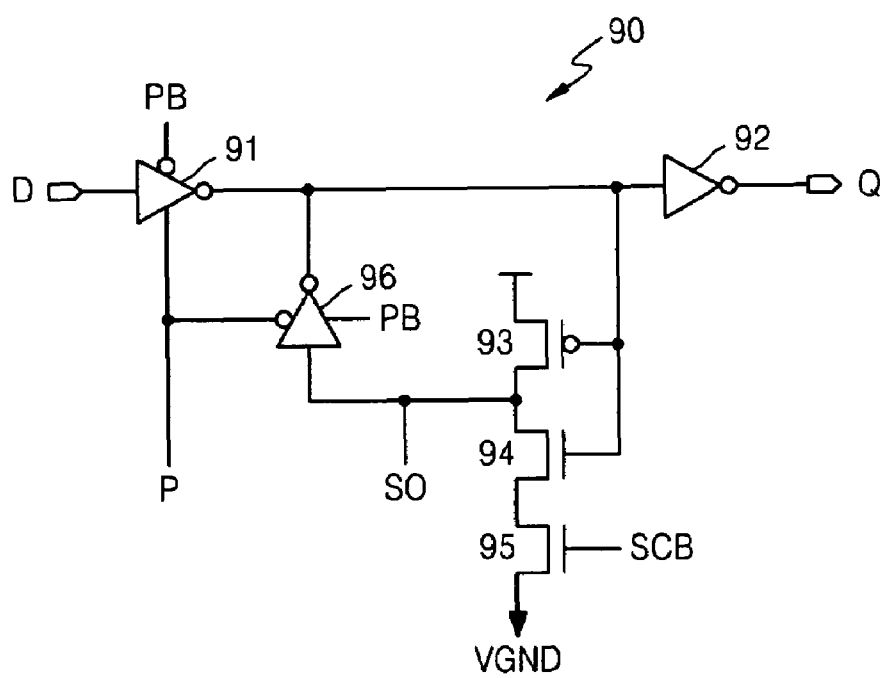

FIGS. 8A and 8B are circuit diagrams of the latch units illustrated in FIGS. 6 and 7. Referring to FIG. 8A, a latch unit 80 includes a transfer circuit unit including a tri-state buffer 81, an inverter 82, and a latch including two tri-state buffers 83 and 84.

The first tri-state buffer 81 receives an input signal D and transfers the input signal D to the inverter 82 in response to pulse signals P and PB generated in the pulse generator 63. The second tri-state buffer 83 outputs data from the first tri-state buffer 81 in response to internal clock signals SC and SCB generated in the scan and retention latch unit 65. The third tri-state buffer 84 outputs data from the second tri-state buffer 83 in response to the pulse signals P and PB.

The second and third tri-state buffers 83 and 84 form the latch. An output SO of the second tri-state buffer 83 is input to the scan and retention latch unit 65. The output SO of the scan and retention latch unit 65 may be input to the third tri-state buffer 84. A signal output from the inverter 82 is an output signal Q of the latch unit 80. The first through third tri-state buffers 81, 83, and 84 can be replaced with transfer circuits including an inverter and a transfer gate.

Referring to FIG. 8B, a latch unit 90 includes a first tri-state buffer 91 that receives an input signal D and transfers the input signal D to an inverter 92 in response to the pulse signals P and PB generated in the pulse generator 63. A PMOS transistor 93 is connected in series between a voltage source and a first NMOS transistor 94. The first NMOS transistor 94 is connected in series between the PMOS transistor 93 and a second NMOS transistor 95. An output signal of the first tri-state buffer 91 is applied to gates of the PMOS transistor 93 and the first NMOS transistor 94. The second NMOS transistor 95 is connected in series between the first NMOS transistor 94 and a virtual ground, and the internal clock signal SCB is applied to a gate of the second NMOS transistor 95. A signal SO of a node between the PMOS transistor 93 and the first NMOS transistor 94 is an input of a second tri-state buffer 96. The second tri-state buffer 96 outputs the signal SO of the node in response to the pulse signals P and PB.

The PMOS transistor 93, the first and second NMOS transistors 94 and 95, and the second tri-state buffer 96 form a latch. The signal SO of the node is input to the scan and retention latch unit 65. The output SO of the scan and retention latch unit 65 may be input to the second tri-state buffer 96. A signal output from the inverter 92 is an output signal Q of the latch unit 90. The tri-state buffers 91 and 96 may be replaced with transfer circuits including an inverter and a transfer gate.

Figure 9:
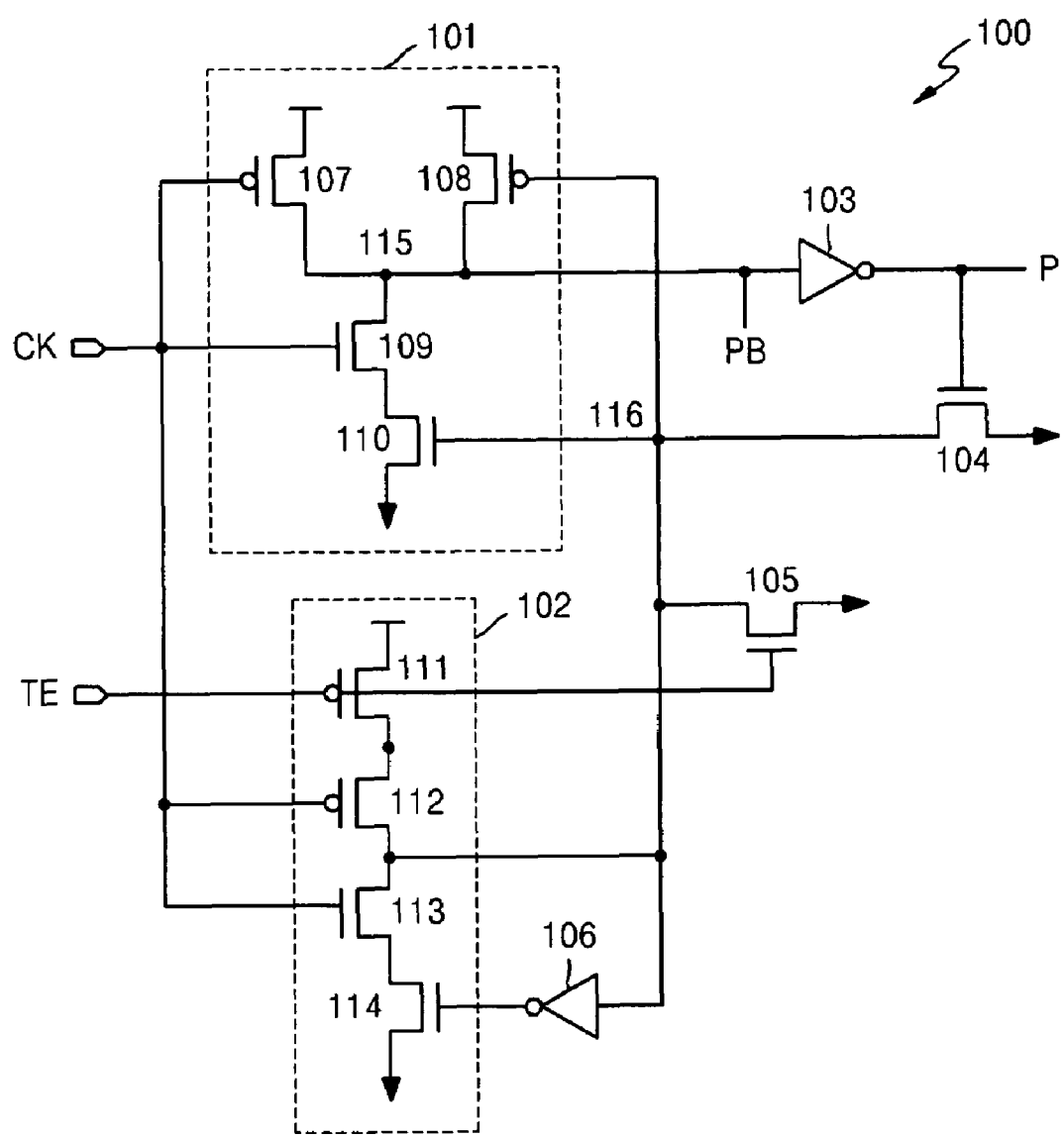
FIG. 9 is a circuit diagram of a pulse generator illustrated in FIG. 6.

FIG. 9 is a circuit diagram of the pulse generator illustrated in FIG. 6. Referring to FIG. 9, a pulse generator 100 includes a first NAND gate 101, a second NAND gate 102, a first inverter 103, a first NMOS transistor 104, a second NMOS transistor 105, and a second inverter 106.

The second NAND gate 102 performs a transfer gate function that outputs a signal in response to the scan enable signal TE.

The first NAND gate 101 includes a first PMOS transistor 107 which is connected between a voltage source and a first node 115, a second PMOS transistor 108 that is connected between the voltage source and the first node 115, a third NMOS transistor 109 connected in series between the first node 115 and a virtual ground, and a fourth NMOS transistor 110. The clock signal CK is applied to gates of the first PMOS transistor 107 and the third NMOS transistor 109. The second node 116 is applied to a gate of the second PMOS transistor 108 and a gate of the fourth NMOS transistor 110.

The second NAND gate 102 includes third and fourth PMOS transistors 111 and 112, and fifth and sixth NMOS transistors 113 and 114 connected in series between the voltage source and the virtual ground. The scan enable signal TE is applied to a gate of the third PMOS transistor 111, the clock signal CK is applied to gates of the fourth PMOS transistor 112 and the fifth NMOS transistor 113, and an output of the second inverter 106 is applied to a gate of the sixth NMOS transistor 114. A node between the fourth PMOS transistor 112 and the fifth NMOS transistor 113 is connected to the second node 116.

An inverted pulse signal PB of the first node 115 of the first NAND gate 101 is input to the first inverter 103. A signal output from the first inverter 103 is a pulse signal P. The first NMOS transistor 104 is connected between the second node 116 and the virtual ground. The output of the first inverter 103 is applied to a gate of the first NMOS transistor 104. The second NMOS transistor 105 is connected between the second node 116 and the virtual ground. The scan enable signal TE is applied to a gate of the second NMOS transistor 105. The second inverter 106 receives a signal from the second node 116, inverts the received signal, and outputs the inverted signal to a gate of the sixth NMOS transistor 114.

Figure 10:
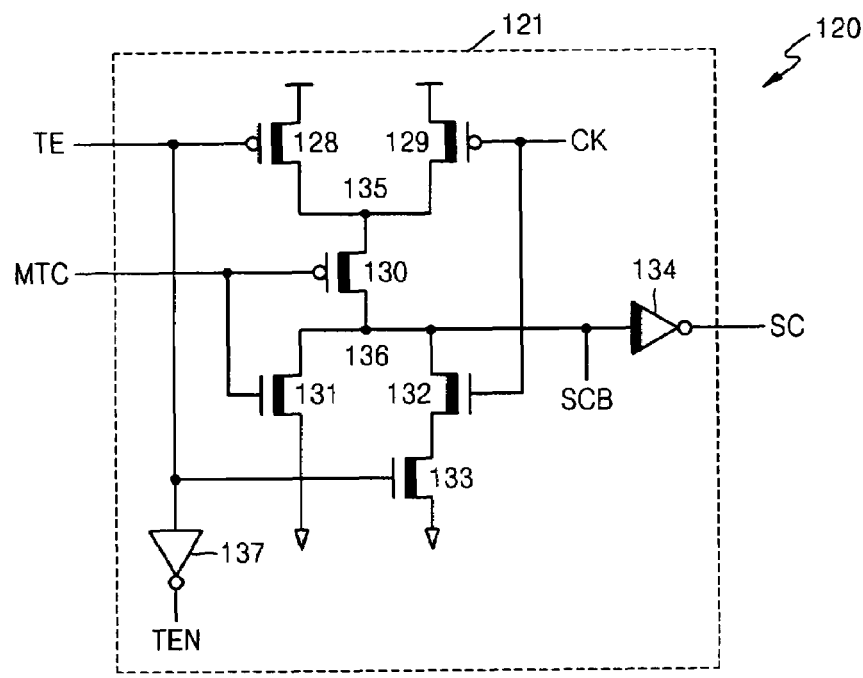
FIG. 10 is a circuit diagram of a scan and retention latch unit illustrated in FIG. 6.
Figure 10:
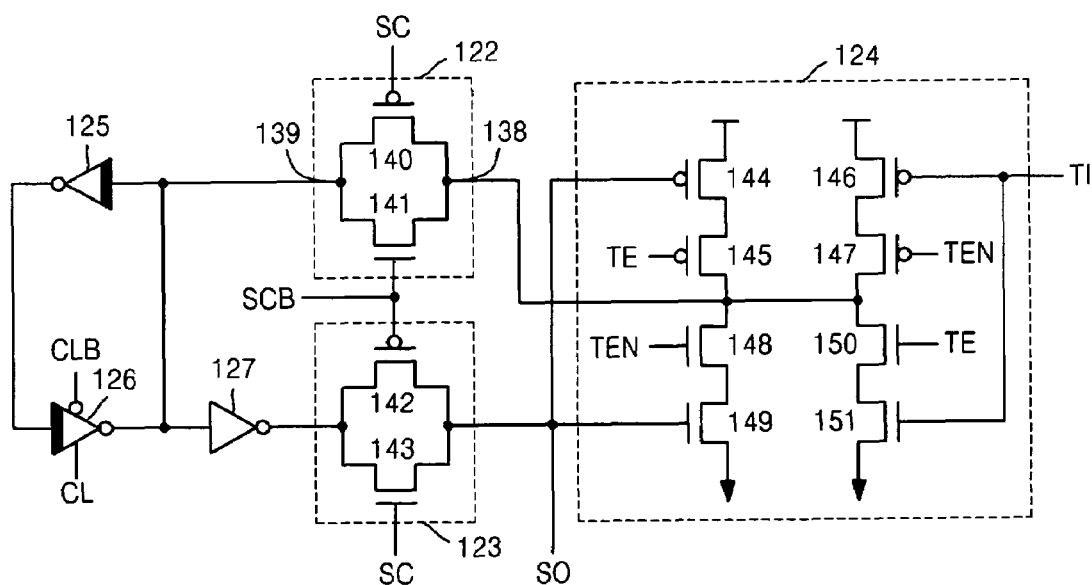

FIG. 10 is a circuit diagram of the scan and retention latch unit illustrated in FIG. 6. Referring to FIG. 10, a scan and retention latch unit 120 includes an internal clock generator 121, a first transfer gate 122, a second transfer gate 123, a multiplexer 124, a first inverter 125, a tri-state buffer 126, and a second inverter 127.

The internal clock generator 121 receives the clock signal CK, the scan enable signal TE, and the MTCMOS control signal MTC, and generates the internal clock signals SC and SCB.

The first transfer gate 122 transfers an output of the multiplexer 124 in response to an inverted internal clock signal SCB. The second transfer gate 123 transfers an output of the second inverter 127 in response to the internal clock signal SC. The multiplexer 124 selectively outputs the scan signal TI and the output signal SO of the latch unit 120 in response to the scan enable signal TE.

The first inverter 125 inverts an output of the first transfer gate 122. The tri-state buffer 126 inverts an output of the first inverter 125 in response to signals CL and CLB. Outputs of the first inverter 125 and the tri-state buffer 126 are applied to respective inputs thereof to form a latch. The second inverter 127 inverts an output of the tri-state buffer 126 and transfers the inverted output to the second transfer gate 123.

The internal clock generator 121 includes a first PMOS transistor 128 connected between a voltage source and a first node 135, a third PMOS transistor 130 connected between the first node 135 and a second node 136, a first NMOS transistor 131 connected between the second node 136 and a ground, second and third NMOS transistors 132 and 133 connected in series between the second node 136 and the ground, a third inverter 134 that inverts a signal of the second node 136, and a fourth inverter 137 that inverts the scan enable signal TE.

The scan enable signal TE is applied to gates of the first PMOS transistor 128 and the third NMOS transistor 133. The clock signal CK is applied to gates of a second PMOS transistor 129 and the second NMOS transistor 132. The MTCMOS control signal MTC is applied to gates of the third PMOS transistor 130 and the first NMOS transistor 131.

An inverted internal clock signal SCB is applied to the second node 136. An output of the third inverter 134 is the internal clock signal SC. The output of the fourth inverter 137 is an inverted scan enable signal TEN.

The first transfer gate 122 includes a fourth PMOS transistor 140 and a fourth NMOS transistor 141 connected in parallel between a third node 138 and an input terminal of the first and second inverters 125 and 127. The internal clock signal SC is applied to a gate of the fourth PMOS transistor 140. The inverted internal clock signal SCB is applied to a gate of the fourth NMOS transistor 141.

The second transfer gate 123 includes a fifth PMOS transistor 142 and a fifth NMOS transistor 143 connected in parallel between an output of the second inverter 127 and an SO terminal. The inverted internal clock signal SCB is applied to a gate of the fifth PMOS transistor 142. The internal clock signal SC is applied to a gate of the fifth NMOS transistor 143.

The multiplexer 124 includes a sixth PMOS transistor 144 and a seventh PMOS transistor 145 which are connected in series between the voltage source and the third node 138, and an eighth PMOS transistor 146 and a ninth PMOS transistor 147 which are connected in series between the voltage source and the third node 138. A sixth NMOS transistor 148 and a seventh NMOS transistor 149 are connected in series between the third node 138 and a virtual ground, and an eighth NMOS transistor 150 and a ninth NMOS transistor 151 are connected in series between the third node 138 and the virtual ground. The SO terminal is applied to gates of the sixth PMOS transistor 144 and the seventh NMOS transistor 149. The scan signal TI is applied to gates of the eighth PMOS transistor 146 and the ninth NMOS transistor 151. The scan enable signal TE is applied to gates of the seventh PMOS transistor 145 and the eighth NMOS transistor 150. The inverted scan enable signal TEN is applied to gates of the eighth NMOS transistor 148 and the ninth PMOS transistor 147.

The operation of the flip-flop of FIG. 6 will now be described with reference to FIGS. 6 and 8 through 10.

If the MTCMOS control signal MTC and the scan enable signal TE are logic 0, the second node 116 of the pulse generator 100 illustrated in FIG. 9 is logic 1 and the pulse signals P and PB are generated according to the clock signal CK. The latch unit 90 illustrated in FIG. 8B latches the input signal D in response to the pulse signals P and PB. The latched signal is transferred to the scan and retention latch unit 120 illustrated in FIG. 10 via the SO line. The multiplexer 124 illustrated in FIG. 10 outputs the data SO output from the latch unit 90 to the first transfer gate 122 since the scan enable signal TE is logic 0. The first inverter 125 and the tri-state buffer 126 illustrated in FIG. 10 latch the data SO output from the latch unit 90.

If the MTCMOS control signal is logic 0 and the scan enable signal TE is logic 1, the pulse generator 100 illustrated in FIG. 9 is powered off and the pulse signals P and PB are not generated. The multiplexer 124 illustrated in FIG. 10 outputs the scan signal TI to the first transfer gate 122. The latch unit 90 illustrated in FIG. 8B does not receive the data D since the pulse signals P and PB are not generated. The second inverter 127 illustrated in FIG. 10 receives the scan signal TI via the SO terminal. In this case, the first inverter 125 and the tri-state buffer 126 illustrated in FIG. 10 are masters and the latch unit 90 illustrated in FIG. 8B is a slave, thereby forming a master slave structure.

If the MTCMOS control signal MTC is logic 1, the internal clock signal SC illustrated in FIG. 10 is always logic 1. Therefore, the first transfer gate 122 is turned off and the second transfer gate 123 is turned on. The scan and retention latch unit 120 retains data most recently stored in the latch unit 90 that has stopped receiving the data SO.

Figure 11:
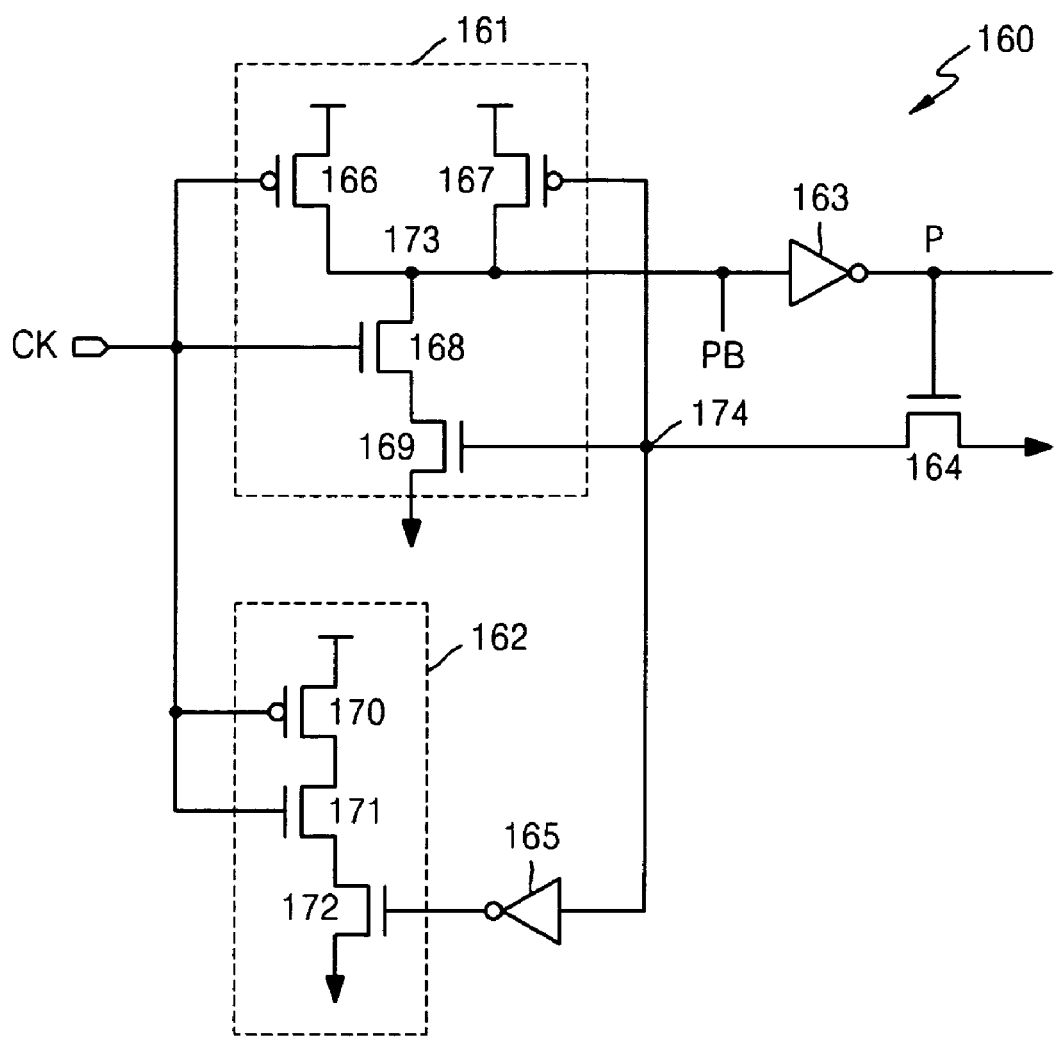
FIG. 11 is a circuit diagram of a pulse generator illustrated in FIG. 7.

FIG. 11 is a circuit diagram of the pulse generator illustrated in FIG. 7. Referring to FIG. 11, a pulse generator 160 includes a first NAND gate 161, a second NAND gate 162, a first inverter 163, a first NMOS transistor 164, and a second inverter 165.

The first NAND gate 161 includes a first PMOS transistor 166, which is connected between a voltage source and a first node 173, a second PMOS transistor 167 connected between the voltage source and the first node 173, a second NMOS transistor 168 connected in series between the first node 173 and a virtual ground, and a third NMOS transistor 169. The clock signal CK is applied to a gate of the first PMOS transistor 166 and the second NMOS transistor 168. The second node 174 is applied to a gate of the second PMOS transistor 167 and a gate of the third NMOS transistor 169.

The second NAND gate 162 includes a third PMOS transistor 170 connected in series between the voltage source and the virtual ground, and fourth and fifth NMOS transistors 171 and 172. The clock signal CK is applied to gates of the third PMOS transistor 170 and the fourth NMOS transistor 171. The output of the second inverter 165 is applied to a gate of the fifth NMOS transistor 172.

An inverted pulse signal PB of the first node 173 of the first NAND gate 161 is applied to the first inverter 163. A signal output from the first inverter 163 is the pulse signal P. The first NMOS transistor 164 is connected between the second node 174 and the virtual ground. An output of the first inverter 163 is applied to a gate of the first NMOS transistor 164. The second inverter 165 receives a signal from the second node 174, inverts the received signal, and transfers the inverted signal to a gate of the fifth NMOS transistor 172.

Figure 12:
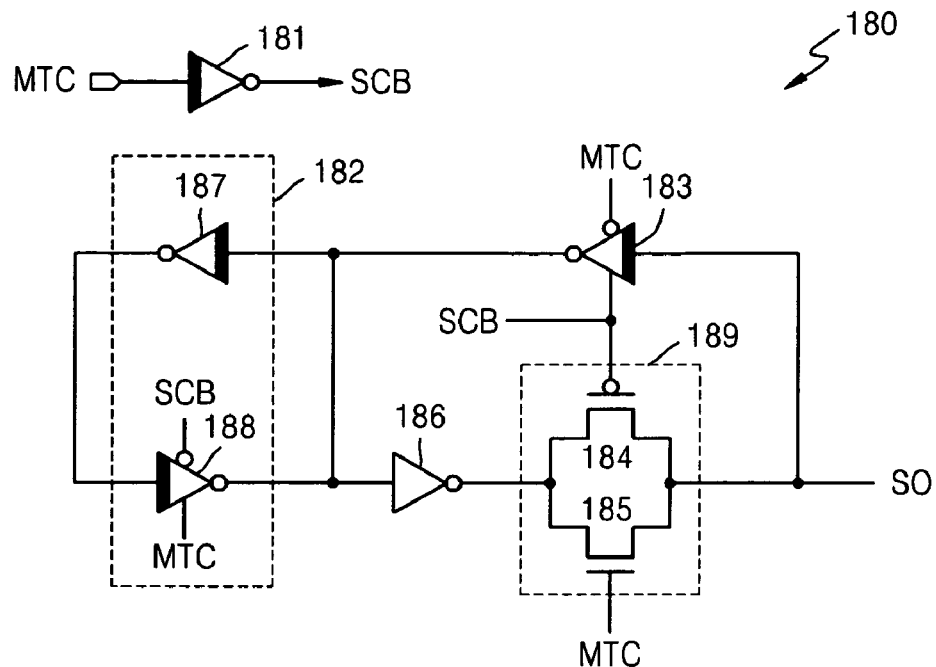
FIG. 12 is a circuit diagram of a retention latch unit illustrated in FIG. 7.

FIG. 12 is a circuit diagram of the retention latch unit illustrated in FIG. 7. Referring to FIG. 12, a retention latch unit 180 includes a first inverter 181 that inverts the MTCMOS control signal MTC, which functions here as the internal clock signal SC, and generates the inverted internal clock signal SCB, a first tri-state buffer 183 that transfers the signal SO output from the latch unit 180 in response to the inverted internal clock signal SCB, a second inverter 187 that inverts an output signal of the first tri-state buffer 183, a second tri-state buffer 188 that transfers an output signal of the second inverter 187 in response to the MTCMOS control signal MTC, a third inverter 186 that inverts an output of the second tri-state buffer 188, and a transfer gate 189 that transfers an output signal of the third inverter 186 to an SO terminal in response to the MTCMOS control signal MTC.

The transfer gate 189 includes a PMOS transistor 184 and an NMOS transistor 185 connected in parallel between an output of the third inverter 186 and the SO terminal. The inverted internal clock signal SCB is applied to a gate of the PMOS transistor 184. The MTCMOS control signal MTC is applied to a gate of the NMOS transistor 185. Outputs of the second inverter 187 and the second tri-state buffer 188 are applied to respective inputs thereof to form a latch 182.

The operation of the flip-flop of FIG. 7 will now be described with reference to FIGS. 7, 8, 11, and 12.

If the MTCMOS control signal MTC is logic 0, the inverted internal clock signal SCB in FIG. 12 is logic 1. The pulse generator 160 illustrated in FIG. 11 generates the pulse signals P and PB according to the clock signal CK. The latch unit 90 illustrated in FIG. 8B latches input data D in response to the pulse signals P and PB. The data is transferred to the retention latch unit 180 illustrated in FIG. 12 via the SO terminal. Since the MTCMOS control signal MTC is logic 0 and the inverted internal clock signal SCB is logic 1, the first tri-state buffer 183 illustrated in FIG. 12 transfers a signal of the SO terminal and the transfer gate 189 is turned off. The data input via the SO terminal is latched in the second inverter 187 and the second tri-state buffer 188.

If the MTCMOS control signal MTC is logic 1, the inverted internal clock signal SCB is logic 0. In this case, the first tri-state buffer 183 is turned off and the transfer gate 189 is turned on. The first tri-state buffer 183 does not transfer the data of the SO terminal. The retention latch unit 180 retains data most recently latched therein. Since the transfer gate 189 is turned on, the data latched in the retention latch unit 180 may be transferred to the latch unit 90 illustrated in FIG. 8B via the SO terminal when the flip-flop 70 is turned on.

Figure 13:
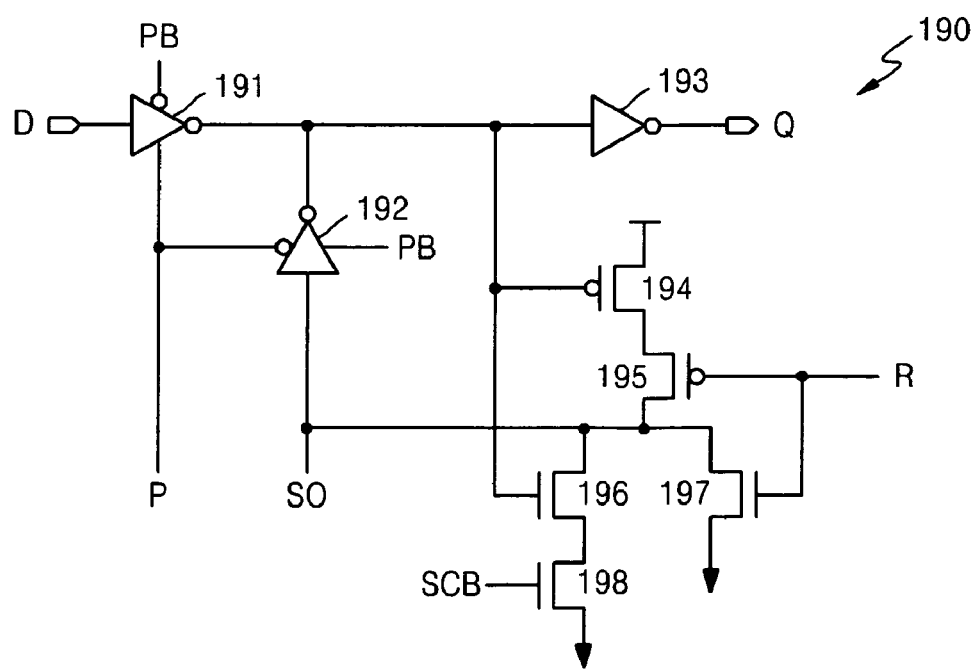
FIG. 13 is a circuit diagram of a latch unit included in a flip-flop illustrated in FIG. 7 with a reset function according to an exemplary embodiment of the present invention.

FIG. 13 is a circuit diagram of a latch unit included in the flip-flop illustrated in FIG. 7 with a reset function according to an exemplary embodiment of the present invention. Referring to FIG. 13, a latch unit 190 includes a first tri-state buffer 191 that transfers input data D in response to pulse signals P and PB, an inverter 193 that inverts an output of the first tri-state buffer 191 and transfers the inverted output to an output Q of the latch unit 190, first and second PMOS transistors 194 and 195 connected in series between a voltage source and an SO terminal, first and second NMOS transistors 196 and 198 connected in series between the SO terminal and a virtual ground, a third NMOS transistor 197 connected in series between the SO terminal and the virtual ground and connected in parallel to the first and second NMOS transistors 196 and 198, and a second tri-state buffer 192 that transfers a signal of the SO terminal to an input of the inverter 193 in response to an inverted pulse signal PB.

Gates of the first PMOS transistor 194 and the first NMOS transistor 196 are applied to an output of the first tri-state buffer 191. A reset signal R is applied to gates of the second PMOS transistor 195 and the third NMOS transistor 197. An inverted internal clock signal SCB is applied to a gate of the second NMOS transistor 198.

Figure 14:
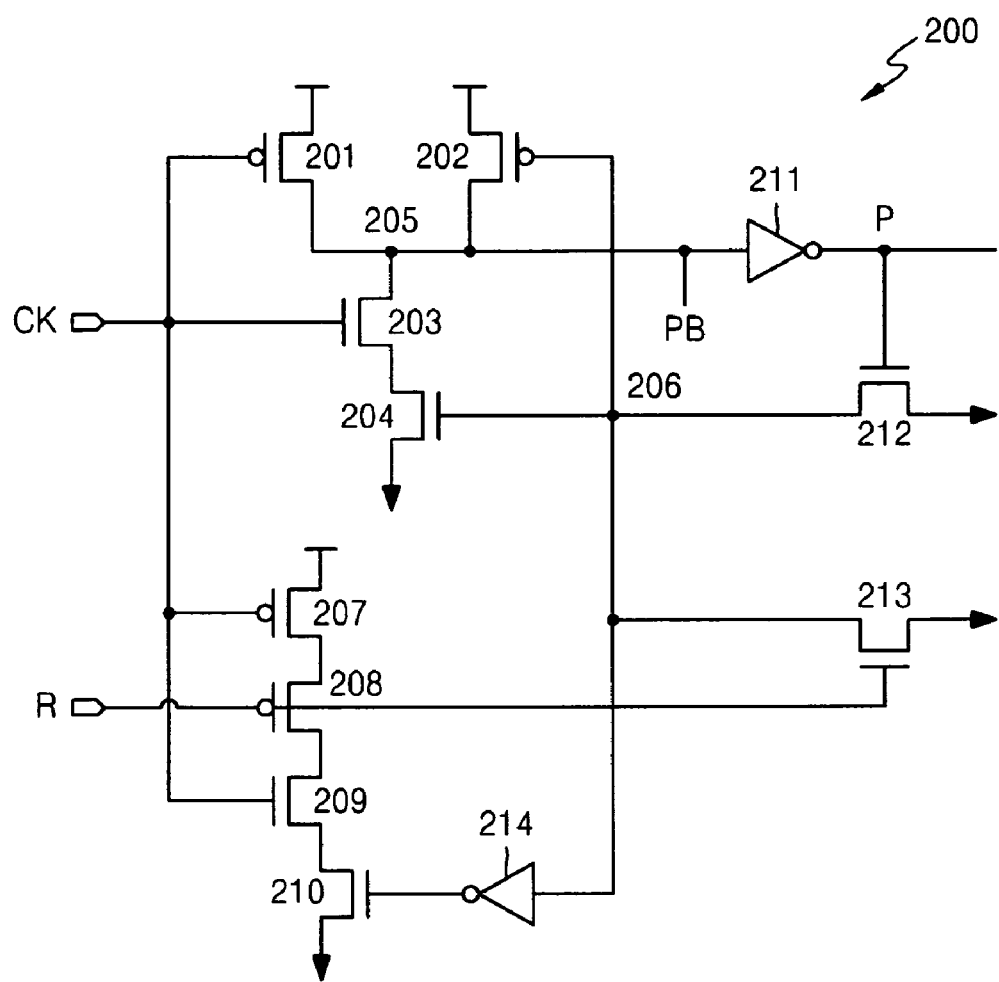
FIG. 14 is a circuit diagram of a pulse generator included in the flip-flop illustrated in FIG. 7 with a reset function according to an exemplary embodiment of the present invention.

FIG. 14 is a circuit diagram of a pulse generator included in the flip-flop illustrated in FIG. 7 with a reset function according to an exemplary embodiment of the present invention. Referring to FIG. 14, a pulse generator 200 includes first and second PMOS transistors 201 and 202 connected in parallel between a voltage source and a first node 205, first and second NMOS transistors 203 and 204 connected in series between the first node 205 and a virtual ground, third and fourth PMOS transistors 207 and 208 and third and fourth NMOS transistors 209 and 210 connected in series between the voltage source and the virtual ground, a first inverter 211 for inverting a signal of the first node 205, a fifth NMOS transistor 212 connected between a gate of the second NMOS transistor 204 and the virtual ground, a sixth NMOS transistor 213 connected between a second node 206 and the virtual ground, and a second inverter 214 for inverting a signal of the second node 206 and outputting the inverted signal to a gate of the fourth NMOS transistor 210.

The clock signal CK is applied to the first PMOS transistor 201, the first NMOS transistor 203, the third PMOS transistor 207, and the third NMOS transistor 209. The second node 206 is applied to gates of the second PMOS transistor 202 and the second NMOS transistor 204. A reset signal R is applied to gates of the fourth PMOS transistor 208 and the sixth NMOS transistor 213. An output signal P of the first inverter 211 is applied to the fifth NMOS transistor 212. An output signal of the second inverter 214 is applied to a gate of the fourth NMOS transistor 210.

Figure 15:
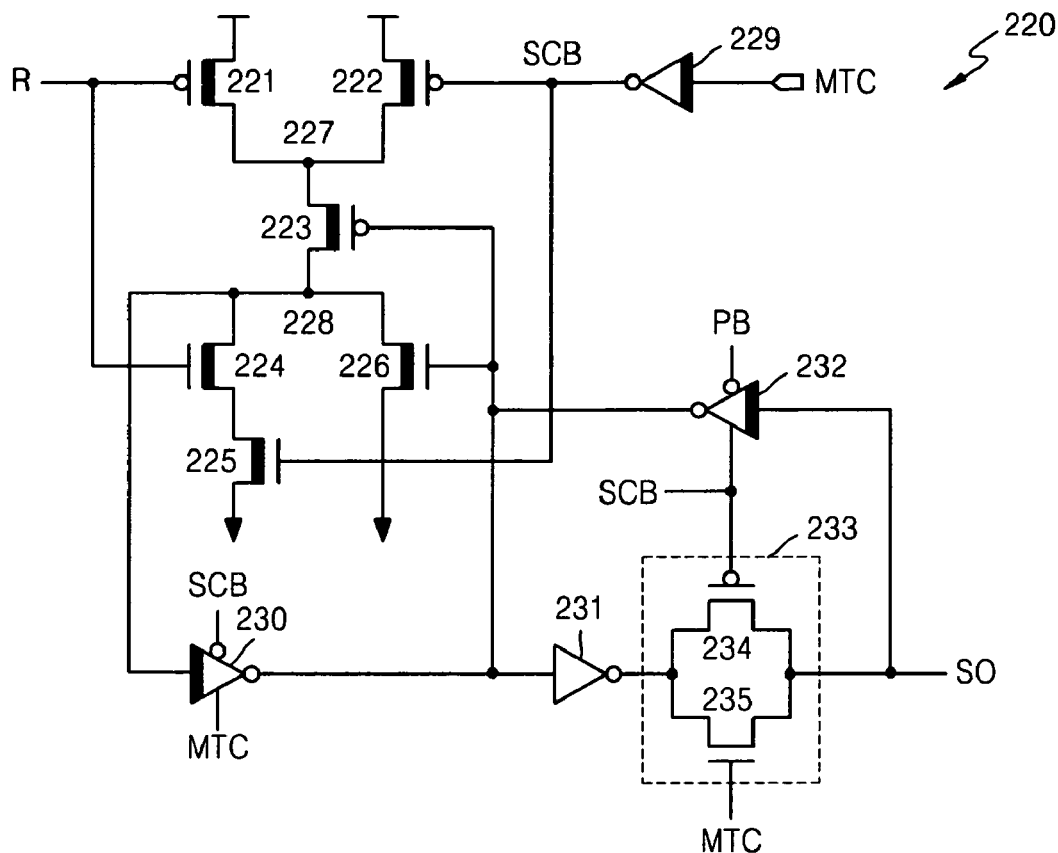
FIG. 15 is a circuit diagram of a retention latch unit included in the flip-flop illustrated in FIG. 7 with the reset function according to an exemplary embodiment of the present invention.

FIG. 15 is a circuit diagram of a retention latch unit included in the flip-flop illustrated in FIG. 7 with the reset function according to an exemplary embodiment of the present invention. Referring to FIG. 15, a retention latch unit 220 includes first and second PMOS transistors 221 and 222 connected in parallel between a voltage source and a first node 227, a third PMOS transistor 223 connected between the first node 227 and a second node 228, first and second NMOS transistors 224 and 225 connected in series between the second node 228 and a virtual ground, a third NMOS transistor 226 connected between the second node 228 and the ground and connected in parallel to the first and second NMOS transistors 224 and 225, a first inverter 229 for inverting the MTCMOS control signal MTC, a first tri-state buffer 230 for transferring a signal of the second node 228 in response to the MTCMOS control signal MTC, a second inverter 231 for inverting an output of the first tri-state buffer 230, a transfer gate 233 for transferring an output signal of the second inverter 231 in response to the MTCMOS control signal MTC, and a second tri-state buffer 232 for transferring an output signal of the transfer gate 233 in response to the inverted internal clock signal SCB.

The output of the first inverter 229 that is an inverted MTCMOS control signal MTC is the inverted internal clock signal SCB, and an output of the transfer gate 233 is applied to an SO terminal.

A reset signal R is supplied to gates of the first PMOS transistor 221 and the first NMOS transistor 224. The output signal SCB of the first inverter 229 is applied to gates of the second PMOS transistor 222 and the second NMOS transistor 225. Gates of the third PMOS transistor 223 and the third NMOS transistor 226 receive outputs of the first tri-state buffer 232 and the second tri-state buffer 230.

The transfer gate 233 includes a fourth PMOS transistor 234 and a fourth NMOS transistor 235 connected in parallel between the second inverter 231 and an SO line. The inverted internal clock signal SCB is applied to a gate of the fourth PMOS transistor 234. The MTCMOS control signal MTC is applied to a gate of the fourth NMOS transistor 235.

Figure 16:
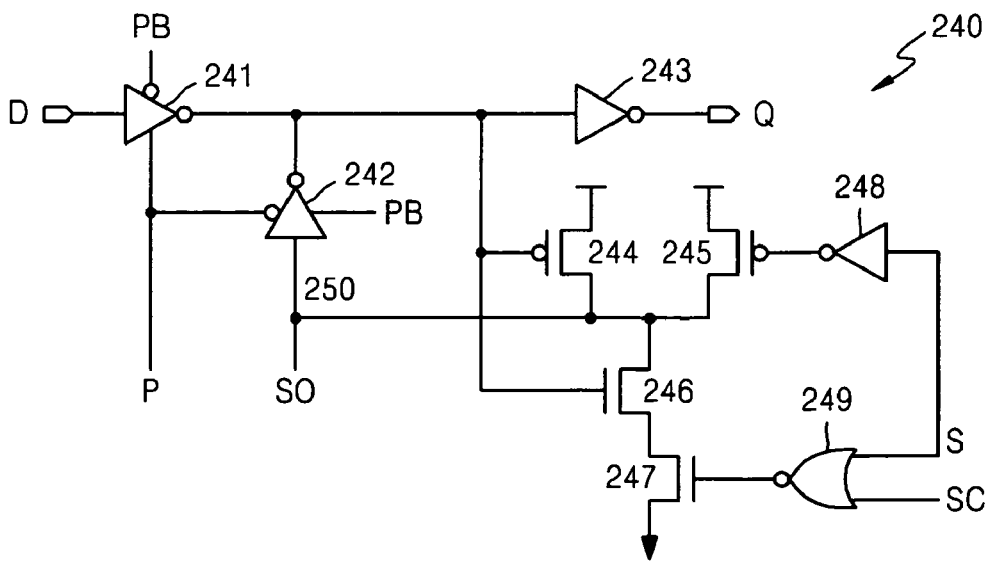
FIG. 16 is a circuit diagram of a latch unit included in the flip-flop illustrated in FIG. 7 with a set function according to an exemplary embodiment of the present invention.

FIG. 16 is a circuit diagram of a latch unit included in the flip-flop illustrated in FIG. 7 with a set function according to an exemplary embodiment of the present invention. Referring to FIG. 16, a latch unit 240 includes a first tri-state buffer 241 for transferring input data D in response to a pulse signal P, a second tri-state buffer 242 for transferring a signal of a first node 250 in response to an inverted pulse signal PB, a first inverter 243 connected to output terminals of the first tri-state buffer 241 and the second tri-state buffer 242, for inverting an input signal and outputting the inverted signal as an output signal Q of the latch unit 240, first and second PMOS transistors 244 and 245 connected in parallel between a voltage source and the first node 250, first and second NMOS transistors 246 and 247 connected in series between the first node 250 and a virtual ground, a second inverter 248 for inverting a set signal S, and a NOR gate 249 for performing a NOR operation on the set signal S and an internal clock signal SC.

The first node 250 is the SO terminal of the latch unit 220 illustrated in FIG. 15. Output signals of the first tri-state buffer 241 and the second tri-state buffer 242 are applied to gates of the first PMOS transistor 244 and the first NMOS transistor 246. An output of the second inverter 248 is applied to a gate of the second PMOS transistor 245. An output signal of the NOR gate 249 is applied to a gate of the second NMOS transistor 247.

Figure 17:
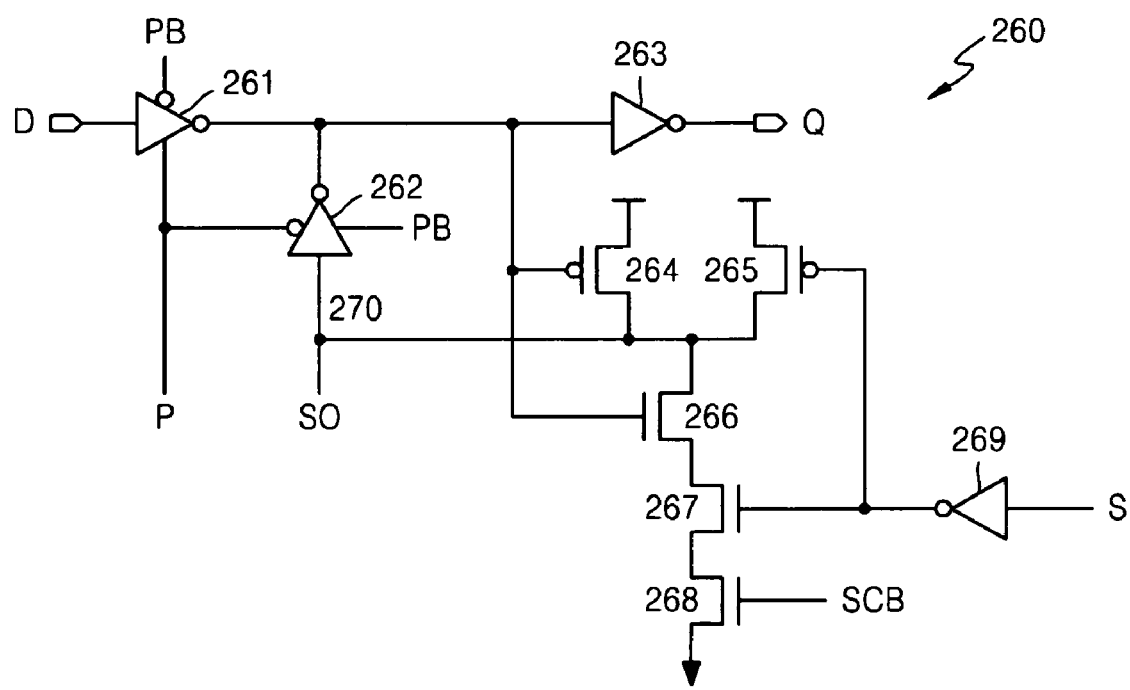
FIG. 17 is a circuit diagram of a latch unit included in the flip-flop illustrated in FIG. 7 with the set function according to another exemplary embodiment of the present invention.

FIG. 17 is a circuit diagram of a latch unit included in the flip-flop illustrated in FIG. 7 with the set function according to another exemplary embodiment of the present invention. Referring to FIG. 17, the latch unit 260 includes a first tri-state buffer 261 for transferring input data D in response to a pulse signal P, a second tri-state buffer 262 for transferring a signal of a first node 270 in response to an inverted pulse signal PB, a first inverter 263 connected to output terminals of the first tri-state buffer 261 and the second tri-state buffer 262 for inverting an input signal and outputting the inverted signal as an output signal Q of the latch unit 260, first and second PMOS transistors 264 and 265 connected in parallel between a voltage source and the first node 270, first through third NMOS transistors 266, 267, and 268 connected in series between the first node 270 and a virtual ground, and a second inverter 269 for inverting a set signal S.

The first node 270 is the SO terminal of the latch unit 220 illustrated in FIG. 15. Output signals of the first tri-state buffer 261 and the second tri-state buffer 262 are applied to gates of the first PMOS transistor 264 and the first NMOS transistor 266. An output of the second inverter 269 is applied to a gate of the second PMOS transistor 265 and the second NMOS transistor 267. The inverted internal clock signal SCB is applied to a gate of the third NMOS transistor 268.

The pulse generators of the flip-flop illustrated in FIGS. 16 and 17 are identical to the pulse generator 200 illustrated in FIG. 14. The retention latch unit of the flip-flop illustrated in FIGS. 16 and 17 is identical to the retention latch unit 220 illustrated in FIG. 15.

The flip-flop illustrated in FIGS. 13 through 15 has the same function as the flip-flop illustrated in FIG. 7 and additionally includes the reset function. The flip-flop illustrated in FIGS. 16 and 17 has the same function as the flip-flop illustrated in FIG. 7 and additionally includes the set function.

It is to be understood by one of ordinary skill in the art that exemplary embodiments discussed above in connection with the sleep mode are also applicable to other power-save modes such as a standby mode or idle mode.

While the present invention has been particularly illustrated and described with reference to exemplary embodiments thereof, it will be understood by those of ordinary skill in the art that various changes in form and details may be made therein without departing from the spirit and scope of the present invention as defined by the following claims.

What is claimed is:

1. A multi-threshold CMOS (MTCMOS) flip-flop for latching a data input signal in response to a clock signal and converting the latched signal to a data output signal, the flip-flop comprising:

a latch unit receiving the data input signal in a normal mode, latching the data input signal based on pulse signals and internal clock signals, transferring the latched data to an output terminal of the latch unit, outputting the transferred data as the data output signal, and performing a scan function by latching a scan signal;

a pulse generator generating the pulse signals based on the clock signal and a scan enable signal, the pulse signals including a pulse signal and an inverted pulse signal; and a scan and retention latch unit generating the internal clock signals based on the clock signal and the scan enable signal, the internal clock signals including an internal clock signal and an inverted clock signal, storing data last input to the latch unit during the normal mode in a sleep mode in response to a control signal for controlling the sleep mode and the normal mode, performing a data retention function by transferring the stored data to the latch unit when the flip-flop returns to the normal mode from the sleep mode, performing the scan function by latching the scan signal, and transferring the scan signal to the latch unit, wherein the latch unit is connected to the scan and retention latch unit via a signal transfer line.

2. The flip-flop of claim 1, wherein the flip-flop has a master-slave flip-flop structure in which the scan and retention latch unit is a master and the latch unit is a slave when performing the scan function.

3. The flip-flop of claim 1, wherein, when the scan enable signal is in a first state, the latch unit latches the data input signal in an input terminal of the latch unit based on a state of the pulse signals, and when the scan enable signal is in a second state, the latch unit latches the scan signal in the scan and retention latch unit based on the internal clock signals.

4. The flip-flop of claim 1, wherein, if the control signal and the scan enable signal are in the first state, the flip-flop performs a normal function, if the control signal is in the first state and the scan enable signal is in the second state, the flip-flop performs the scan function, and if the control signal is in the second state, the flip-flop performs the data retention function.

5. The flip-flop of claim 4, wherein, when the flip-flop performs the normal function, the latch unit transfers data to the scan and retention latch unit via the signal transfer line, when the flip-flop performs the data retention function, the scan and retention latch unit stops receiving a signal output from the latch unit and retains data received from the latch unit during the normal mode, when the flip-flop returns to the normal mode, the latch unit receives data stored in the scan and retention latch unit via the signal transfer line, when the flip-flop performs the scan function, the scan and retention latch unit receives the scan signal, the latch unit outputs the scan input signal output from the scan and retention latch unit, and the flip-flop has a master-slave flip-flop structure in which the scan and retention latch unit is a master and the latch unit is a slave.

6. The flip-flop of claim 1, wherein the latch unit comprises:

a first tri-state buffer receiving the data input signal and transferring the data input signal in response to the pulse signals;

a second tri-state buffer transferring a signal of the signal transfer line in response to the pulse signals;

a third tri-state buffer transferring outputs of the first and second tri-state buffers to the signal transfer line in response to the internal clock signals; and an inverter inverting the outputs of the first and second tri-state buffers and outputting the inverted outputs, wherein an output of the inverter is the data output signal.

7. The flip-flop of claim 1, wherein the latch unit comprises:

a first tri-state buffer receiving the data input signal and transferring the data input signal in response to the pulse signals;

a second tri-state buffer transferring a signal of the signal transfer line in response to the pulse signals;

a PMOS transistor, a first NMOS transistor, and a second NMOS transistor connected in series between a voltage source and a virtual ground; and an inverter inverting the outputs of the first and second tri-state buffers and outputting the inverted outputs, wherein gates of the PMOS transistor and the first NMOS transistor are connected to output terminals of the first and second tri-state buffers, the inverted internal clock signal is applied to a gate of the second NMOS transistor, and a node between the PMOS transistor and the first NMOS transistor is applied to the signal transfer line.

8. The flip-flop of claim 1, wherein the pulse generator comprises:

first and second PMOS transistors connected in parallel between a voltage source and a first node;

first and second NMOS transistors connected in series between the first node and a virtual ground;

third and fourth PMOS transistors connected in series between the voltage source and a second node;

third and fourth NMOS transistors connected in series between the second node and the virtual ground;

fifth and sixth NMOS transistors connected in parallel between the second node and the virtual ground;

a first inverter inverting an output of the first node and outputting the inverted signal; and a second inverter inverting a signal of the second node and outputting the inverted signal, wherein the clock signal is applied to gates of the first PMOS transistor, the first NMOS transistor, the fourth PMOS transistor, and the third NMOS transistor, the scan enable signal is applied to gates of the third PMOS transistor and the sixth NMOS transistor, the signal of the second node is applied to gates of the second PMOS transistor and the second NMOS transistor, an output of the first inverter is applied to a gate of the fifth NMOS transistor, and an output of the second inverter is applied to a gate of the fourth NMOS transistor; and an output of the first node is the inverted pulse signal, and the output of the first inverter is the pulse signal.

9. The flip-flop of claim 1, wherein the scan and retention latch unit comprises:

an internal clock generator receiving the clock signal, the scan enable signal, and the control signal, and generating the internal clock signals;

a multiplexer selectively outputting the scan signal and a signal applied to the latch unit via the signal transfer line in response to the scan enable signal;

a first transfer gate transferring an output of the multiplexer in response to the internal clock signals;

first and second inverters inverting an output of the first transfer gate;

a tri-state buffer transferring an output of the first inverter to inputs of the first and second inverters in response to the internal clock signals; and a second transfer gate transferring an output of the second inverter to the signal transfer line in response to the internal clock signals.

10. The flip-flop of claim 9, wherein the internal clock generator comprises:

first and second PMOS transistors connected in parallel between a voltage source and a first node;

a third PMOS transistor connected between the first node and a second node;

a first NMOS transistor connected between the second node and a ground voltage;

second and third NMOS transistors connected in series between the second node and the ground voltage;

a first inverter inverting the scan enable signal; and a second inverter inverting an output of the second node, wherein the scan enable signal is applied to gates of the first PMOS transistor and the third NMOS transistor, the clock signal is applied to the second PMOS transistor and the second NMOS transistor, and the control signal is applied to gates of the third PMOS transistor and the first NMOS transistor, the second node is the inverted internal clock signal, an output of the first inverter is an inverted scan enable signal, and an output of the second inverter is the internal clock signal.

11. The flip-flop of claim 10, wherein the multiplexer comprises:

sixth and seventh PMOS transistors connected in series between a voltage source and a third node;

eighth and ninth PMOS transistors connected in series between the voltage source and the third node;

sixth and seventh NMOS transistors connected in series between the third node and a virtual ground;

eighth and ninth NMOS transistors connected in series between the third node and the virtual ground, wherein the signal transfer line is connected to gates of the sixth PMOS transistor and the seventh NMOS transistor, the scan enable signal is applied to gates of the seventh PMOS transistor and the eighth NMOS transistor, the scan signal is applied to the eighth PMOS transistor and the ninth NMOS transistor, and the inverted scan enable signal is applied to the ninth PMOS transistor and the sixth NMOS transistor.

12. The flip-flop of claim 11, wherein the first transfer gate comprises:

a tenth PMOS transistor and a tenth NMOS transistor connected in parallel between the third node and input terminals of the first and second inverters, wherein the internal clock signal is applied to a gate of the tenth PMOS transistor and the inverted internal clock signal is applied to the tenth NMOS transistor, and the second transfer gate comprises:

an eleventh PMOS transistor and an eleventh NMOS transistor connected in parallel between an output terminal of the second inverter and the signal transfer line, wherein the inverted internal clock signal is applied to a gate of the eleventh PMOS transistor and the internal clock signal is applied to a gate of the eleventh NMOS transistor.

13. A multi-threshold CMOS (MTCMOS) flip-flop for latching a data input signal in response to a clock signal and converting the latched signal to a data output signal, the flip-flop comprising:

a latch unit receiving the data input signal in a normal mode, latching the input data based on pulse signals and internal clock signals, transferring the latched data to an output terminal of the latch unit, and outputting the transferred data as the data output signal;

a pulse generator generating the pulse signals based on a clock signal, the pulse signals including a pulse signal and an inverted pulse signal; and a scan and retention latch unit generating the internal clock signals based on the clock signal, the internal clock signals including an internal clock signal and an inverted clock signal, storing data last input to the latch unit during the normal mode in a sleep mode in response to a control signal for controlling the sleep mode and the normal mode, and performing a data retention function by transferring the stored data to the latch unit when the flip-flop returns to the normal mode from the sleep mode, wherein the latch unit is connected to the scan and retention latch unit via a signal transfer line.

14. The flip-flop of claim 13, wherein the latch unit comprises:

a first tri-state buffer receiving the data input signal and transferring the data input signal in response to the pulse signals;

a second tri-state buffer transferring a signal of the signal transfer line in response to the pulse signals;

a third tri-state buffer transferring outputs of the first and second tri-state buffers to the signal transfer line in response to the internal clock signals; and an inverter inverting the outputs of the first and second tri-state buffers and outputting the inverted outputs, wherein an output of the inverter is an output of the flip-flop.

15. The flip-flop of claim 13, wherein the latch unit comprises:

a first tri-state buffer receiving the data input signal and transferring the data input signal in response to the pulse signals;

a second tri-state buffer transferring a signal of the signal transfer line in response to the pulse signals;

a PMOS transistor, a first NMOS transistor, and a second NMOS transistor connected in series to a voltage source and a virtual ground; and an inverter inverting the outputs of the first and second tri-state buffers and outputting the inverted outputs as an output signal of the latch unit, wherein gates of the PMOS transistor and the first NMOS transistor are connected to output terminals of the first and second tri-state buffers, the inverted internal clock signal is applied to a gate of the second NMOS transistor, and a node between the PMOS transistor and the first NMOS transistor is connected to the signal transfer line.

16. The flip-flop of claim 13, wherein the pulse generator comprises:

first and second PMOS transistors connected in parallel between a voltage source and a first node;

first and second NMOS transistors connected in series between the first node and a virtual ground;

a third PMOS transistor, and third and fourth NMOS transistors connected in series between the voltage source and the virtual ground;

a fifth NMOS transistor connected between a second node and the virtual ground;

a first inverter inverting a signal of the first node and outputting the inverted signal; and a second inverter inverting a signal of the second node and outputting the inverted signal,
wherein the clock signal is applied to gates of the first PMOS transistor, the first NMOS transistor, the third PMOS transistor, and the third NMOS transistor, a signal of the second node is applied to gates of the second PMOS transistor and the second NMOS transistor, an output of the first inverter is applied to a gate of the fifth NMOS transistor, and an output of the second inverter is applied to a gate of the fourth NMOS transistor; and
an output of the first node is the inverted pulse signal, and the output of the first inverter is the pulse signal.

17. The flip-flop of claim 13, wherein the flip-flop comprises a retention latch unit that uses the control signal as the internal clock signal, the retention latch unit comprising:
a first inverter inverting the control signal and generating the inverted internal clock signal;
a first tri-state buffer transferring a signal of the signal transfer line in response to the internal clock signals;
second and third inverters inverting an output of the first tri-state buffer;
a second tri-state buffer transferring an output of the second inverter to input terminals of the second and third inverters in response to the internal clock signals; and
a transfer gate transferring an output of the third inverter to the signal transfer line in response to the internal clock signals.

18. The flip-flop of claim 17, wherein the transfer gate comprises:
a PMOS transistor and an NMOS transistor connected in parallel between an output terminal of the third inverter and the signal transfer line,
wherein the inverted clock signal is applied to a gate of the PMOS transistor and the internal clock signal is applied to a gate of the NMOS transistor.

19. The flip-flop of claim 13, wherein the latch unit comprises:
a first tri-state buffer receiving the data input signal and transferring the data input signal in response to the pulse signals;
a second tri-state buffer transferring a signal of the signal transfer line in response to the pulse signals;
an inverter inverting the outputs of the first and second tri-state buffers and outputting the inverted outputs as the data output signal,
first and second PMOS transistors connected in series between a voltage source and the signal transfer line;
first and second NMOS transistors connected in series between the signal transfer line and a virtual ground; and
a third NMOS transistor connected between the signal transfer line and the virtual ground;
wherein gates of the first PMOS transistor and the first NMOS transistor are applied to output terminals of the first and second tri-state buffers, the inverted internal clock signal is applied to a gate of the second NMOS transistor, and a reset signal for resetting the flip-flop is applied to gates of the second PMOS transistor and the third NMOS transistor.

20. The flip-flop of claim 13, wherein the pulse generator comprises:
first and second PMOS transistors connected in parallel between a voltage source and a first node;
first and second NMOS transistors connected in series between the first node and a virtual ground;
third and fourth PMOS transistors and third and fourth NMOS transistors connected in series between the voltage source and the virtual ground;
fifth and sixth NMOS transistors connected between a second node and the virtual ground;
a first inverter inverting a signal of the first node; and
a second inverter inverting a signal of the second node,
wherein the clock signal is applied to gates of the first PMOS transistor, the first NMOS transistor, the third PMOS transistor, and the third NMOS transistor, the signal of the second node is applied to gates of the second PMOS transistor and the second NMOS transistor, a reset signal for resetting the flip-flop is applied to gates of the fourth PMOS transistor and the sixth NMOS transistor, an output signal of the first inverter is applied to a gate of the fifth NMOS transistor, and an output signal of the second inverter is applied to a gate of the fourth NMOS transistor.

21. The flip-flop of claim 13, wherein the flip-flop comprises a retention latch unit that uses the control signal as the internal clock signal, the retention latch unit comprising:
first and second PMOS transistors connected in parallel between a voltage source and a first node;
a third PMOS transistor connected between the first node and a second node;
first and second NMOS transistors connected in series between the second node and a ground voltage;
a third NMOS transistor connected between the second node and the ground voltage;
a first inverter inverting the control signal and generating the inverted internal clock signal;
a first tri-state buffer transferring a signal of the second node in response to the internal clock signals;
a second inverter inverting an output of the first tri-state buffer;
a transfer gate transferring an output signal of the second inverter to the signal transfer line in response to the internal clock signals; and
a second tri-state buffer transferring one of an output signal of the transfer gate and a signal of the signal transfer line in response to the internal clock signals,
wherein a reset signal for resetting the flip-flop is applied to gates of the first PMOS transistor and the first NMOS transistor, an output signal of the first inverter is applied to a gate of the second PMOS transistor and the second NMOS transistor, output terminals of the first and second tri-state buffers are applied to gates of the third PMOS transistor and the third NMOS transistor.

22. The flip-flop of claim 21, wherein the transfer gate comprises:
a fourth PMOS transistor and a fourth NMOS transistor connected in parallel between the second inverter and the signal transfer line,
wherein the inverted internal clock signal is applied to a gate of the fourth PMOS transistor and the internal clock signal is applied to a gate of the fourth NMOS transistor.

23. The flip-flop of claim 13, wherein the latch unit comprises:
a first tri-state buffer receiving the data input signal and transferring the data input signal in response to the pulse signals;
a second tri-state buffer transferring a signal of the signal transfer line in response to the pulse signals;
a first inverter inverting the outputs of the first and second tri-state buffers and outputting the inverted outputs as the data output signal, first and second PMOS transistors connected in parallel between a voltage source and the signal transfer line;

first and second NMOS transistors connected in series between the signal transfer line and a virtual ground;

a second inverter inverting a set signal for resetting the flip-flop; and a NOR gate receiving the set signal and the internal clock signal and performing a NOR operation, wherein gates of the first PMOS transistor and the first NMOS transistor are connected to output terminals of the first and second tri-state buffers, an output terminal of the second inverter is applied to a gate of the second PMOS transistor, and an output terminal of the NOR gate is applied to a gate of the second NMOS transistor.

24. The flip-flop of claim 13, wherein the latch unit comprises:

a first tri-state buffer receiving the data input signal and transferring the data input signal in response to the pulse signals;

a second tri-state buffer transferring a signal of the signal transfer line in response to the pulse signals;

a first inverter inverting the outputs of the first and second tri-state buffers and outputting the inverted outputs as the data output signal;

first and second PMOS transistors connected in parallel between a voltage source and the signal transfer line;

first through third NMOS transistors connected in series between the signal transfer line and a virtual ground; and a second inverter inverting a set signal for resetting the flip-flop, wherein gates of the first PMOS transistor and the first NMOS transistor are connected to output terminals of the first and second tri-state buffers, an output terminal of the second inverter is applied to gates of the second PMOS transistor and the second NMOS transistor, and the inverted internal clock signal is applied to a gate of the third NMOS transistor.

25. A multi-threshold CMOS (MTCMOS) latch device, comprising:

a latch unit latching a data input signal during a normal mode based on pulse signals and internal clock signals, outputting the data input signal as a data output signal, and performing a scan function by latching a scan signal;

a pulse generator generating the pulse signals based on a clock signal and a scan enable signal; and a scan and retention latch unit generating the internal clock signals based on the clock signal and the scan enable signal, receiving and storing the data output signal from the latch unit upon entry to a sleep mode from normal mode, the data output signal includes data last input to the latch unit prior to entry to the sleep mode, and transferring the data output signal to the latch unit when returning from the sleep mode to normal mode.

* * * * *